(12) United States Patent
Kim

(10) Patent No.: US 9,091,873 B2
(45) Date of Patent: Jul. 28, 2015

(54) APPARATUS AND METHOD OF FABRICATING THIN FILM PATTERN

(75) Inventor: Jin Wuk Kim, Uiwang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 13/096,614

(22) Filed: Apr. 28, 2011

(65) Prior Publication Data

US 2011/0206847 A1    Aug. 25, 2011

Related U.S. Application Data

(62) Division of application No. 11/639,282, filed on Dec. 15, 2006.

(30) Foreign Application Priority Data

Jun. 23, 2006  (KR) ................. 10-2006-0056739

(51) Int. Cl.
*G02F 1/1333* (2006.01)
*H01L 21/02* (2006.01)
*H01L 21/312* (2006.01)
*H01L 21/67* (2006.01)
*H01L 51/56* (2006.01)
*H01L 27/12* (2006.01)

(52) U.S. Cl.
CPC .......... *G02F 1/1333* (2013.01); *H01L 21/0212* (2013.01); *H01L 21/02288* (2013.01); *H01L 21/3127* (2013.01); *H01L 21/6715* (2013.01); *G02F 2202/022* (2013.01); *G02F 2202/28* (2013.01); *H01J 2209/02* (2013.01); *H01L 27/124* (2013.01); *H01L 27/1292* (2013.01); *H01L 51/56* (2013.01)

(58) Field of Classification Search
USPC ........................................... 427/256
See application file for complete search history.

(56) References Cited

U.S. PATENT DOCUMENTS 3,085,907 A  * 4/1963 Zdanowski et al. ........ 427/393.6
4,295,976 A    10/1981 Dessaint et al.
4,752,353 A    6/1988 Blanding et al.
(Continued)

FOREIGN PATENT DOCUMENTS

FR   2 328 070     5/1977
JP   4-234054 A    8/1992
(Continued)

OTHER PUBLICATIONS

Products List of Fluoroadditives (Surfactants and Surface Modifiers) http://www.dic-europe.de/downloads/faprodctlist.pdf no date.*
(Continued)

*Primary Examiner* — Alex A Rolland
(74) *Attorney, Agent, or Firm* — Birch, Stewart, Kolasch & Birch, LLP

(57) ABSTRACT

A fabricating method and apparatus of a thin film pattern improves the reliability of forming the thin film pattern by a resist printing method. The apparatus includes a print roller device of a roll shape around which a blanket is wound; a spray device located around the print roller device for spraying an etch resist solution to the blanket; and a print plate of an engraved shape where a groove of a desired thin film shape and a projected part except the groove are formed, and the etch resist solution has a surfactant inclusive of an ethylene oxide fluorinated polymer material.

7 Claims, 9 Drawing Sheets

POLYMER CHAIN

HYDRO CARBON CHAIN OF SURFACTANT

HYDROPHOBIC RADICAL(FLUORINE RADICAL)OF SURFACTANT

(56) References Cited

U.S. PATENT DOCUMENTS

| | | | |
|---|---|---|---|
| 4,808,501 A * | 2/1989 | Chiulli | 430/7 |
| 5,079,122 A | 1/1992 | Bayley et al. | |
| 5,533,447 A | 7/1996 | Johnson et al. | |
| 5,887,522 A | 3/1999 | Bocko et al. | |
| 6,313,244 B1 * | 11/2001 | Tanaka et al. | 526/242 |
| 6,472,028 B1 * | 10/2002 | Frazzitta et al. | 427/494 |
| 7,651,211 B2 * | 1/2010 | Mori | 347/101 |
| 2002/0058411 A1 | 5/2002 | Hasegawa et al. | |
| 2003/0203104 A1 | 10/2003 | Crommentuyn et al. | |

FOREIGN PATENT DOCUMENTS

| | | |
|---|---|---|
| JP | 10-330683 A | 12/1998 |
| JP | 2000-327968 A | 11/2000 |
| JP | 2001-194785 A | 7/2001 |
| JP | 2001-269564 A | 10/2001 |
| JP | 2001-318459 A | 11/2001 |
| JP | 2003-015278 A | 1/2003 |
| JP | 2004-286795 A | 10/2004 |
| JP | 2005-126608 A | 5/2005 |
| JP | 2005126608 A * | 5/2005 |
| JP | 2006-037060 A | 2/2006 |
| JP | 2006-83243 A | 3/2006 |
| WO | WO 2005/030917 A1 | 4/2005 |

OTHER PUBLICATIONS

Machine Translation of JP 2005-126608.

* cited by examiner

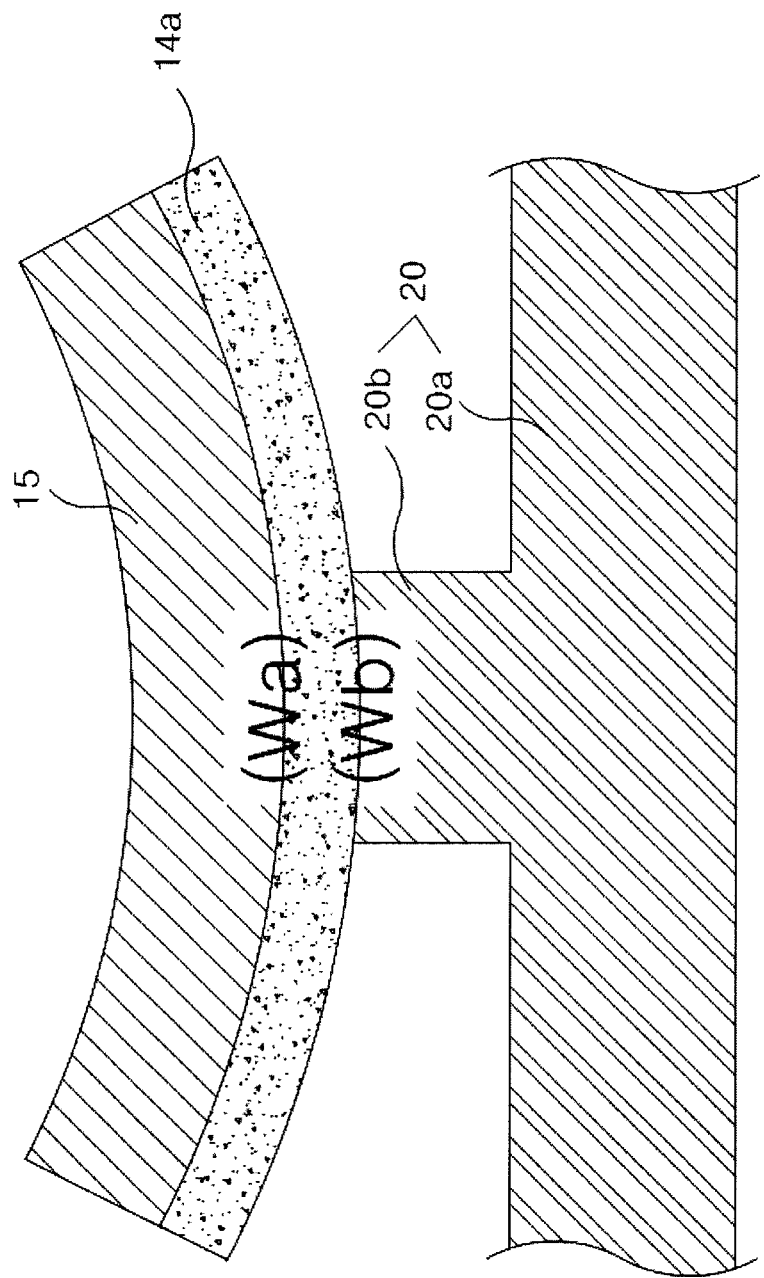

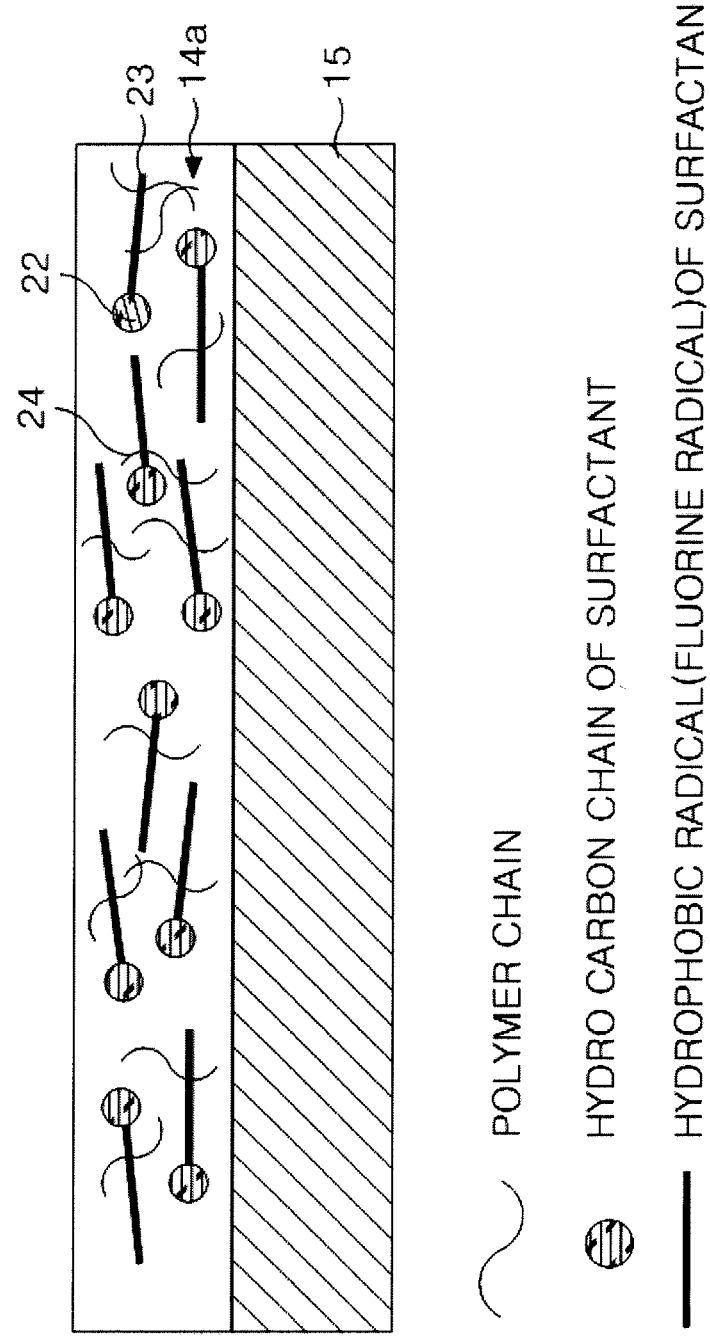

APPARATUS AND METHOD OF FABRICATING THIN FILM PATTERN

This application is a Divisional of co-pending application Ser. No. 11/639,282 filed on Dec. 15, 2006, which claims priority to Application No. 10-2006-0056739 filed in Korea, on Jun. 23, 2006. The entire contents of all of the above applications are hereby incorporated by reference.

BACKGROUND OF THE INVENTION

1. Field of the Invention

The invention pertains to a fabricating method of a thin film pattern of a display panel, and more particularly to a reverse resist printing device and a fabricating method of a thin film pattern using the same.

2. Description of the Related Art

Recently, various flat panel display devices, which can reduce the weight and size that are a disadvantage of a cathode ray tube, have been on the rise. The flat panel display devices includes liquid crystal displays, field emission displays, plasma display panels, organic electro luminescence (hereinafter, referred to as 'EL') displays, etc.

Among these, the liquid crystal display devices control the light transmittance of liquid crystal by using an electric field, thereby displaying a picture. To this end, a liquid crystal display device includes a liquid crystal display panel where liquid crystal cells are arranged in a matrix shape, and a drive circuit for driving the liquid crystal display panel.

The liquid crystal display panel includes a thin film transistor array substrate and a color filter array substrate that face each other; a spacer for keeping a fixed cell gap between the two substrates; and a liquid crystal filled in the cell gap.

A thin film transistor array substrate includes gate lines and data lines, a thin film transistor formed as a switch device at each of the crossing parts of the gate lines and the data lines; a pixel electrode formed by the unit of a liquid crystal cell to be connected to the thin film transistor; and an alignment film spread thereon. The gate lines and the data lines receive signals from drive circuits through pads, respectively. The thin film transistor supplies a pixel signal supplied to the data line to a pixel electrode in response to a scan signal supplied to the gate line.

A color filter array substrate includes color filters formed by the unit of a liquid crystal cell; a black matrix for dividing the color filters and reflecting an external light; a common electrode for commonly supplying a reference voltage to the liquid crystal cells; and an alignment film spread thereon.

Separately making the thin film transistor array substrate and the color filter array substrate and bonding them together complete the liquid crystal display panel. Then, a liquid crystal is injected and the panel is sealed.

A photolithography process and an etching process form the thin film patterns within the related art liquid crystal display panel.

However, the photolithography process includes a number of processes such as an exposure process, a development process, a cleaning process, an inspection process, etc, thereby causing an increase of the manufacturing cost of the liquid crystal display panel. Accordingly, a method of patterning a thin film by a reverse resist printing method is used instead of the photolithography process.

FIG. 1 shows a diagram representing a reverse resist printing device.

The reverse resist printing device shown in FIG. 1 includes a print roller device 10 having a roll shape where a blanket 15 composed of polydimethylsiloxane (PDMS) is wound. An etch resist solution spray device 12 sprays an etch resist resin solution, and an engraved print plate 20 includes a groove 20A, which has the same shape as a thin film pattern that is to be formed, and a projected part 20B which borders the groove 20A.

FIGS. 2A to 2E are diagrams that explain the forming of a thin film pattern by the reverse resist printing device of FIG. 1. Especially, FIGS. 2A to 2D represent a forming process of a gate pattern of the liquid crystal display panel by using the reverse resist printing method.

First, as shown in FIG. 2A, an etch resist solution 14A from the etch resist solution spray device 12 is sprayed onto the blanket 15 that is wound around the print roller device 10. The print roller device 10 rotates to coat the blanket 15 with the etch resist solution 14A.

Then, as shown in FIG. 2B, the etch resist solution 14A transfers only to the projected part 20B in the print roller device 10 as the print roller device 10 coated with the etch resist 14A simultaneously rotates and contacts the print plate 20. Accordingly, as shown in FIG. 2C, an etch resist solution 14B having a desired thin film pattern shape remains on the print roller device 10.

Then, as shown in FIG. 2D, the etch resist solution 14B, which was transferred to the print roller device 10, transfers again onto a substrate 30 where a designated metal layer, e.g., a gate metal layer, is formed. Then, the resist is cured. Accordingly, as shown in FIG. 2E, the etch resist pattern 14C for patterning the metal layer 32A can be formed. Afterwards, the metal layer 32A not overlapping the etch resist pattern 14C is patterned, thereby forming the desired thin film pattern on the substrate 30. Here, if forming the gate pattern such as the gate line, the gate electrode, etc. of the liquid crystal display panel, the gate pattern can be formed using chromium (Cr), aluminum neodymium (AlNd), etc. as the metal layer 32A.

The etch resist solution 14A used in the reverse resist printing device is formed of a basic polymer such as novolac, etc. a carrier solvent, a printing solvent, a surfactant, etc.

Here, the carrier solvent is a solvent that reduces the viscosity of the etch resist solution 14A sprayed from the etch resist solution spray device 12 so that the etch resist solution 14A can be evenly coated over the blanket 15.

The printing solvent is used for the etch resist solution 14A coated on the blanket 15 to impart a tack characteristic or adhesiveness.

The surfactant is a material which is applied to an interface to greatly decrease the surface tension of the interface and which acts to decrease the surface tension of the etch resist solution 14A. If a silicon-based surfactant is used, the coating can be good but the silicon-based material contaminates the blanket. Thus, a fluorine-based surfactant is used. However, the fluorine-based surfactant reduces the surface energy of the etch resist solution 14A, thus the adhesive force between the etch resist solution 14A and the blanket 15 becomes similar to the adhesive force between the etch resist solution 14A and the print plate 20. As a result, the characteristic that the etch resist solution 14A is transferred from the blanket 15 to the print plate 20 decreases, and thus the reliability of forming the thin film pattern by the resist printing method deteriorates.

SUMMARY OF THE INVENTION

Accordingly, it is an object of the invention to provide a fabricating method and apparatus of a thin film pattern that improves the reliability of forming a thin film pattern by a resist printing method by way of improving a transfer characteristic of an etch resist solution.

In order to achieve these and other objects of the invention, a fabricating apparatus of a thin film pattern according to one aspect of the invention includes a print roller device of a roll shape around which a blanket is wound; a spray device located around the print roller device for spraying an etch resist solution to the blanket; and a print plate of an engraved shape where a groove of a desired thin film shape and a projected part except the groove are formed, and the etch resist solution has a surfactant inclusive of an ethylene oxide fluorinated polymer material.

In the invention, the ethylene oxide fluorinate polymer material may be $CF_3(CF_2)_m(CH_2CH_2O)_n$ where m is about 1-10 and n is about 8-50, for example, any one of $CF_3(CF_2)_4 (CH_2CH_2O)_{10}$ and $CF_3(CF_2)_5 (CH_2CH_2O)_{14}$.

In the invention, the etch resist solution has a base polymer of 4~20%, a carrier solvent of 40~60%, a printing solvent of 20~40% and the surfactant of 0.05~1%.

In the invention, the surfactant has molecular structures of hydrocarbons and fluorine radicals, and the molecules of the hydro carbons and fluorine radicals are randomly distributed within the etch resist solution.

In the invention, the hydrocarbon group molecule is at least any one of ethylene oxide ($CH_2CH_2O$), propylene oxide ($CH_2CH_2CH_2O$) or amine ($CH_2N$).

In the invention, an adhesive force between the etch resist solution and the print plate is stronger than an adhesive force between the etch resist solution and the blanket.

In the invention, the base polymer is any one of novolac, and PMMA (poly methyl methacrylate) or PMA (poly methyl acrylate).

In the fabricating apparatus, the carrier solvent is an alcohol group.

In the invention, the printing solvent is at least any one of NMP (N-Methyl pyrrolidone), ethyl benzoate or tri-isopropyl benzene.

The invention, in part, pertains to a fabricating method of a thin film pattern that includes the steps of providing a print roller device of a roll shape around which a blanket is wound; coating the blanket with an etch resist solution inclusive of a surfactant formed of ethylene oxide fluorinated polymer; providing a print plate of an engraved shape where a groove and a projected part except the groove is formed; and transferring the etch resist solution only on the projected part of the print plate and leaving the etch resist solution of an area corresponding to the groove in the print roller device.

The invention, in part, pertains to a resist solution that includes a base polymer, a printing solvent, a carrier solvent, and a surfactant inclusive of an ethylene oxide fluorinated polymer.

BRIEF DESCRIPTION OF THE DRAWINGS

These and other objects of the invention will be apparent from the following detailed description of the embodiments of the invention with reference to the accompanying drawings, in which:

FIG. 4 shows a diagram specifically representing a process of coating an etch resist on a print plate; and FIG. 5 shows a diagram of a typical structure of internal components of an etch resist solution including a surfactant, according to the invention.

DETAILED DESCRIPTION

Reference will now be made in detail to the preferred embodiments of the invention, examples of which are illustrated in the accompanying drawings.

Figure 3:
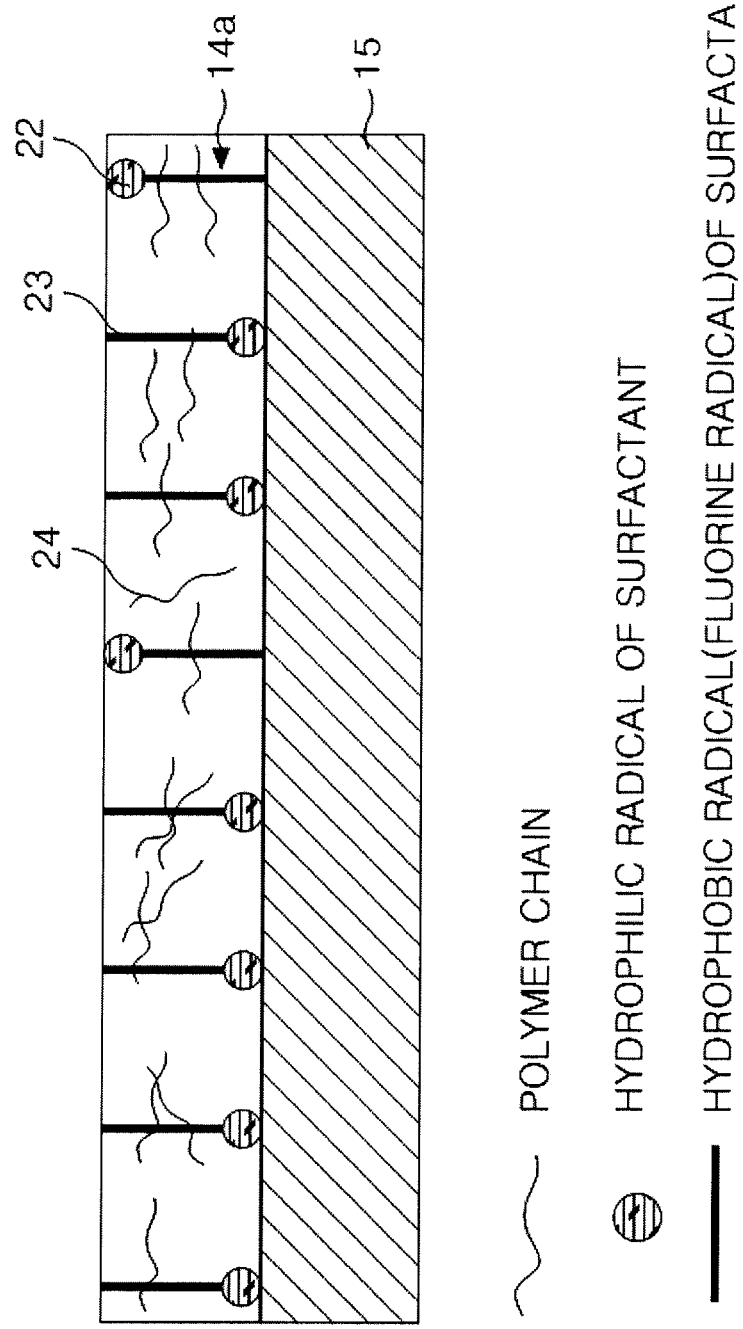
FIG. 3 shows a diagram of a typical structure of internal components of the etch resist solution including a fluorine group surfactant of the related art.

With reference to FIGS. 3 to 5, embodiments of the invention will be explained as follows.

A fabricating method and apparatus of a thin film pattern according to one preferred embodiment of the invention uses an etch resist solution that includes a surfactant inclusive of an ethylene oxide fluorinated polymer. The etch resist solution including this surfactant has a stronger adhesive force with the print plate than with the blanket, thus it becomes possible to easily transfer the etch resist solution from the blanket to the print plate. As a result, the reliability of forming the thin film pattern by a resist printing method can be improved.

Referring to FIGS. 2A to 2D, the etch resist solution of the invention will be explained in detail in conjunction with a fabricating method of a thin film pattern by a resist printing method.

Figure 2A:
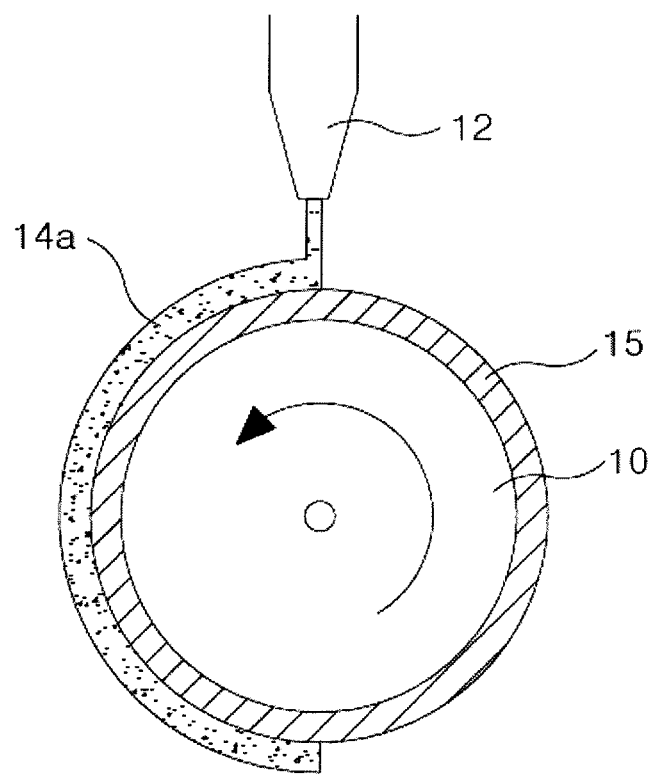
FIGS. 2A to 2E show diagrams representing a process of forming a thin film pattern by a reverse resist printing method, step by step.
Figure 2B:
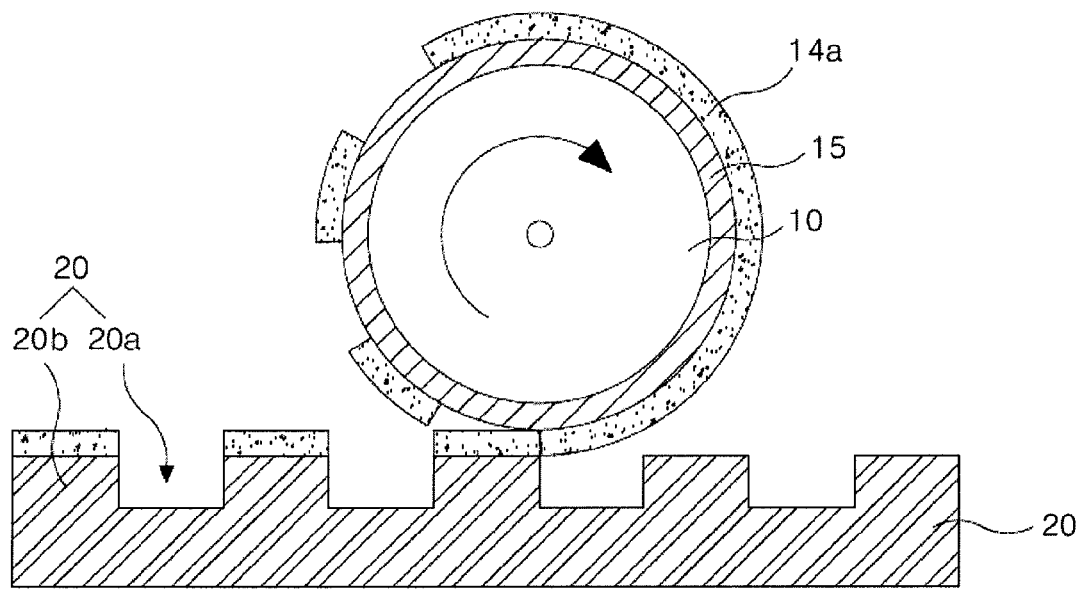
Figure 2C:
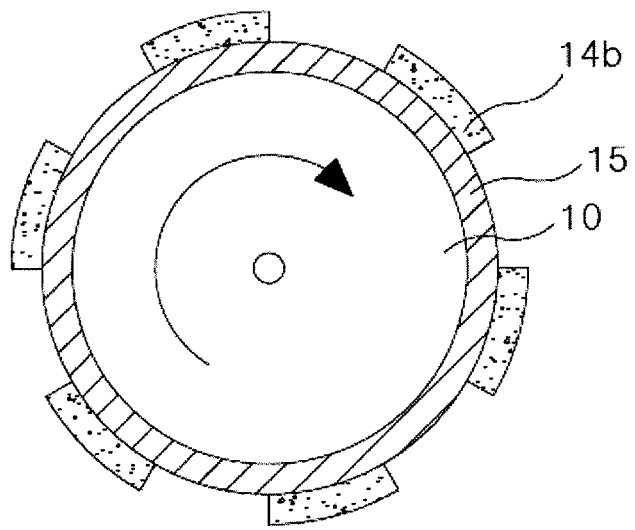
Figure 2D:
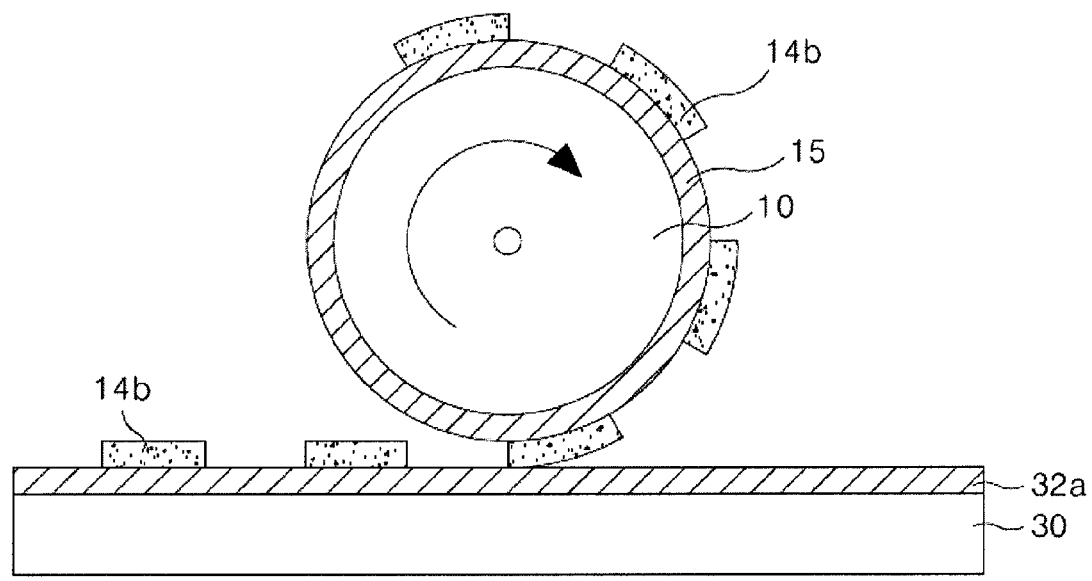
Figure 2E:
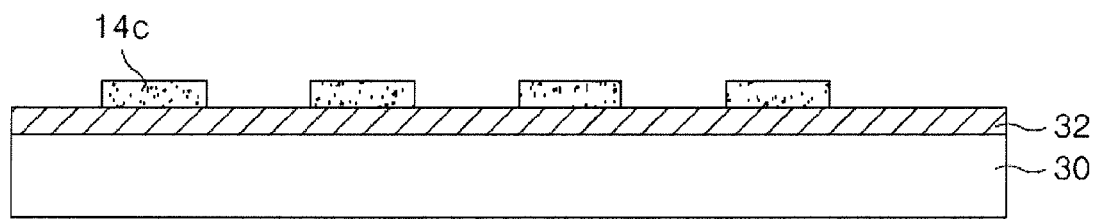

First, as shown in FIG. 2A, an etch resist solution 14A from an etch resist solution spray device 12 is sprayed onto a blanket 15 which is wound around a print roller device 10. The print roller device 10 rotates to evenly coat the etch resist resin solution 14A over the blanket 15. Accordingly, the etch resist solution 14A coats over the blanket 15 of the print roller device 10.

A typical composition of the etch resist solution is as in TABLE 1.

TABLE 1

| Base polymer | Carrier solvent | Printing solvent | Surfactant |
| --- | --- | --- | --- |
| 4~20% | 40~60% | 20~40% | 0.05~1% |

Herein, Novolac, epoxy-Novolac, PMMA (poly methyl methacrylate), PMMA copolymers, PMA (poly methyl acrylate), PMA copolymers etc. are used as the base polymer.

The carrier solvent means a solvent used for evenly coating the etch resist solution 14A over the blanket by reducing the viscosity of the etch resist solution 14A sprayed from the etch resist solution spray device 12. The carrier solvent may be an alcohol such as methanol, ethanol, propanol, isopropanol, butanol etc. Non-alcoholic solvents such as benzene may be used. The carrier solvent may also be a solvent mixture, e.g., a mixture of alcohols. The boiling point of the carrier solvent is preferably less than 100° C.

The printing solvent is used to give the etch resist solution 14A coated over the blanket a sticky characteristic or adhesiveness. The printing solvent is a solvent that dissolves the base polymer well, such as NMP (N-Methyl pyrrolidone), ethyl benzoate, tri-isopropyl benzene, etc. The boiling point of the printing solvent is preferably not less than 200° C.

The surfactant is a material firmly adheres to the interface to greatly decrease the surface tension of the interface, and acts to lower the surface tension of the etch resist solution 14A.

The surfactant may include an ethylene oxide fluorinated polymer material having the general formula $CF_3(CF_2)_m (CH2CH2O)_n$ where m is about 1-10 and n is about 8-50. Typical examples of this material include $CF_3 (CF_2)_4 (CH_2CH_2O)_{10}$, $CF_3 (CF_2)_5 (CH_2CH_2O)_{14}$, etc. Instead of the ethylene oxide moiety, block copolymers of ethylene oxide and propylene oxide can also be used. The surfactant inclusive of the ethylene oxide fluorinated polymer increases the surface energy of the etch resist solution 14A. Accordingly, the etch resist solution 14A has a stronger adhesive force with the print plate 20 than with the blanket 15, thus the etch resist solution 14A can be easily transferred from the blanket 15 to the print plate 20.

With reference to FIGS. 3 to 5, the invention will be explained more specifically as follows.

FIG. 3 shows a diagram of a typical inner structure of an etch resist solution 14A including a fluorinated surfactant of the related art which is coated over the blanket 15.

Referring to FIG. 3, most of the hydrophilic radicals 22 of the surfactant faces in the direction of the blanket 15, which has a low surface energy, and the fluorine radical corresponding to the hydrophobic radical 23 of the surfactant faces the air in the internal structure of the etch resist solution 14A coated over the blanket 15.

Here, the surface energy $\gamma$ is the energy required for forming an interface with the air, and a material having a high surface energy $\gamma$ has difficulty in forming an interface with the air. The characteristic of forming the interface with an opposite surface becomes stronger as the surface energy $\gamma$ of the opposite surface of a liquid state or solid state which in which it contacts becomes lower. That is, the material having the high surface energy $\gamma$, if a fluid material having a low surface energy $\gamma$ is spread thereon, can make the fluid material spread widely. Further, the material having the low surface energy $\gamma$ does not easily form an interface with the opposite material, thereby easily separating from the opposite material and having a strong characteristic of contacting the air. The surface energy $\gamma$ is expressed as the sum of a non-polar surface energy $\gamma d$ and a polar surface energy $\gamma p$, as in Mathematical Formula 1.

$$\gamma = \gamma d + \gamma p \qquad \text{[Mathematical Formula 1]}$$

In relation to the surface energy $\gamma$, TABLE 2 represents $\gamma d$, $\gamma p$ values of each of the blanket 15, the etch resist solution 14A and the print plate 20.

TABLE 2

| | $\gamma$ d (mN/m) | $\gamma$ p (mN/m) |
|---|---|---|
| Blanket | 18.8 | 1.6 |
| Etch resist solution (fluorinated group surfactant included) | 13 | 0 |
| Print plate | 52 | 47 |

Here, in order to easily transfer the etch resist solution 14A from the blanket 15 to the print plate 20, the adhesive force between the etch resist solution 14A and the blanket 15 should be lower than the adhesive force between the etch resist solution 14A and the print plate 20.

That is, as shown in FIG. 4, if the etch resist solution 14A coated on the blanket 15 is transferred to the print plate 20, the adhesive force Wb between the etch resist solution 14A and the print plate 20 should be higher than the adhesive force Wa between the blanket 15 and the etch resist solution 14A.

Herein, the adhesive force W according to $\gamma d$, $\gamma p$ in two interfaces can be shown as in Mathematical Formula 2.

$$W = 2(\gamma d1 * \gamma d2)^{1/2} + 2(\gamma p1 * \gamma p2)^{1/2} \qquad \text{[Mathematical Formula 2]}$$

$\gamma$ d1, $\gamma$ p1 represent the non-polar surface energy and the polar surface energy of any one of the interfaces that are different from each other, and $\gamma$ d2, $\gamma$ p2 represent the non-polar surface energy and the polar surface energy of the other interface between the two different interfaces. The unit of W is mJ/m$^2$.

According to TABLE 1 and Mathematical Formula 2, the adhesive force Wb between the etch resist solution 14A and the print plate 20 is about 52, and the adhesive force Wa between the blanket 15 and the etch resist solution 14A is about 32, thus the difference between two adhesive forces is not high. Here, the mathematically-calculated adhesive force Wb of about 52 between the etch resist solution 14A and the print plate 20 and the adhesive force Wa of about 32 between the blanket 14 and the etch resist solution 14A can have an error or deviation in accordance with variables such as other process conditions. Thus, the difference of about 20 is not a difference with which a reliable transfer process can be performed.

Accordingly, if substantially performing the transfer process, the characteristic of transferring the etch resist solution 14A from the blanket 15 to the print plate 20 decreases, thus the reliability of forming the thin film pattern by the resist printing method deteriorates.

In order to solve the problems of the related art, the invention utilizes a surfactant formed of (or inclusive of) an ethylene oxide fluorinated polymer material having the general formula $CF_3(CF_2)_m (CH_2CH_2O)_n$ where m is about 1-10 and n is about 8-50, such as $CF_3 (CF_2)_4 (CH_2CH_2O)_{10}$, $CF_3 (CF_2)_5 (CH_2CH_2O)_{14}$, etc.

FIG. 5 shows a diagram of a typical inner structure of the etch resist solution 14A in a state where the etch resist solution 14A included in the surfactant in the invention is formed on the blanket 15.

Referring to FIG. 5, in the internal structure of the etch resist solution 14A coated on the blanket 15, the surfactant is divided into a fluorine radical corresponding to the hydrophobic radical 23 and the hydrocarbon chain 22. The hydrocarbon chain 22 may be, for example, ethylene oxide ($CH_2CH_2O$), propylene oxide ($CH_2CH_2CH_2O$) amine ($CH_2N$), etc. The surfactant in the invention having such a structure is a partially-fluorinated surfactant, and the surface energy of the surfactant itself is similar to the surface energy (about 35 mN/m) of a polymer chain, and thus there is no orientation and the molecules are located randomly with respect to the resist polymer 24.

As a result, after adopting the interface energy in the invention, the $\gamma d$, $\gamma p$ values of each of the blanket 15, the etch resist solution 14A and the print plate 20 are as in TABLE 3.

TABLE 3

| | $\gamma d$ | $\gamma p$ |
|---|---|---|
| Blanket | 18.8 | 1.6 |
| Etch resist solution (semifluorinated surfactant included) | 42.2 | 2.0 |
| Print plate | 52 | 47 |

That is, if comparing TABLE 3 with TABLE 2, the $\gamma d$, $\gamma p$ values of the etch resist solution (semifluorinated surfactant included) in the invention are known to be remarkably higher in comparison to the related art of TABLE 2.

Numerically, the adhesive force Wa between the etch resist solution 14A and the print plate 20 is about 113, and the adhesive force Wb between the blanket 15 and the etch resist solution 14A is about 58. That is, the adhesive force Wa between the etch resist solution 14A and the print plate 20 is remarkably higher than the adhesive force Wb between the blanket 15 and the etch resist solution 14A. Thus, the etch resist solution 14A can be easily transferred from the blanket 15 to the print plate 20. The reliability of the transfer process is therefore improved, thereby making it possible to improve the reliability of forming a thin film pattern by the resist printing method.

Figure 1:
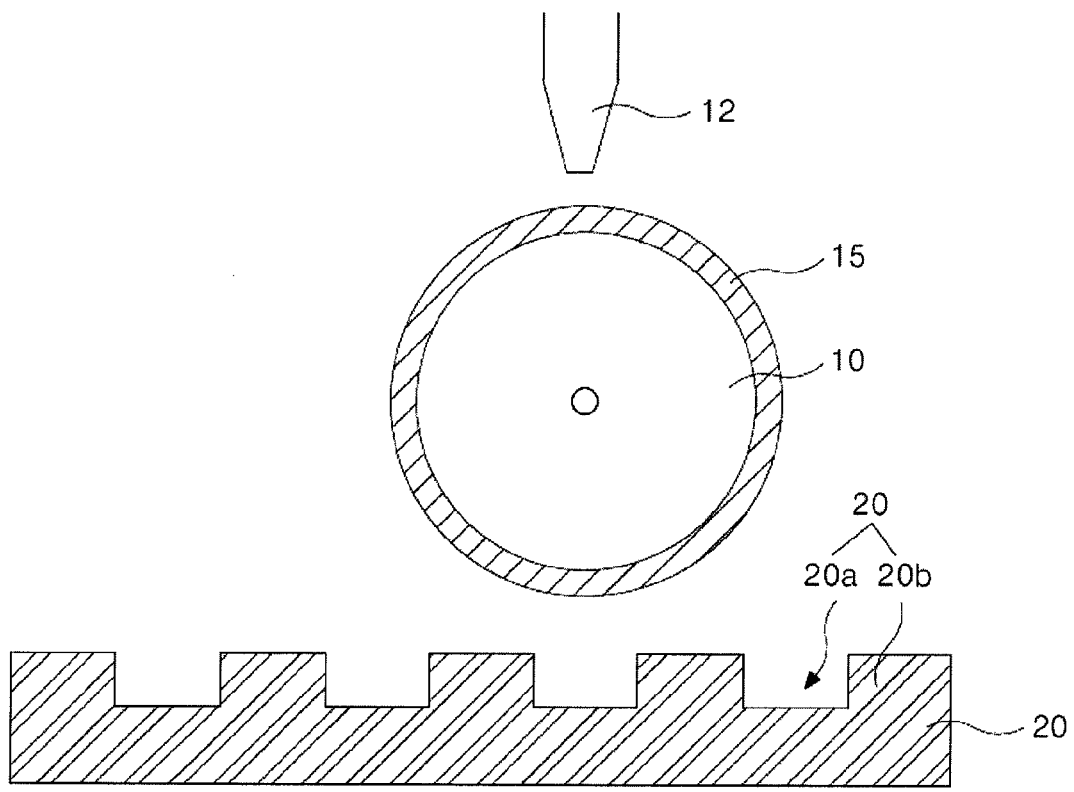
FIG. 1 shows a diagram representing a reverse resist printing device of the related art.

Afterwards, the thin film pattern can be formed by use of the devices shown in FIG. 1 in accordance with the method explained in reference to FIGS. 2B to 2E.

The gate pattern such as the gate electrode, the gate line, etc. of the liquid crystal display device can be formed, no matter how the thin film pattern of the liquid crystal display panel is, by using the fabricating apparatus and method of the thin film pattern according to the invention. Further, the invention is not limited to forming liquid crystal display panels, but includes the thin film pattern of any display device such as a field emission display (FED), plasma display panel (PDP), organic electro luminescence display (OLED), etc. can be formed.

As described above, the fabricating apparatus of the thin film pattern and the fabricating method of the thin film pattern using the same according to the invention uses an etch resist solution that includes an ethylene or propylene oxide fluorinated polymer surfactant. The etch resist solution inclusive of the surfactant has the stronger adhesive force with the print plate than with the blanket, and it is thereby possible to easily transfer the etch resist solution from the blanket to the print plate. As a result, the reliability of forming the thin film pattern by the resist printing method can be improved.

Although the invention has been explained by the embodiments shown in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. A fabricating method of a thin film pattern, comprising:
   providing a print roller device having a roll shape around which a blanket is wound;
   coating the blanket with an etch resist solution including a surfactant inclusive of an ethylene oxide fluorinated polymer;
   providing a print plate of an engraved shape where a groove and a projected part except the groove is formed; and
   transferring the etch resist solution only on the projected part of the print plate and leaving the etch resist solution of an area corresponding to the groove in the print roller device,
   wherein the etch resist solution consists of a base polymer of 4-20%, a carrier solvent of 40-60%, a printing solvent of 20-40% and a surfactant of 0.05-1%,
   wherein the base polymer includes a polymer chain,
   wherein the surfactant includes molecules of a fluorine radical corresponding to a hydrophobic radical and a hydrocarbon chain and is $CF_3(CF_2)_4(CH_2CH_2O)_{10}$ or $CF_3(CF_2)_5(CH_2CH_2O)_{14}$,
   wherein the surfactant has a similar surface energy as the polymer chain of the base polymer, and the molecules of the surfactant are located randomly with respect to the polymer chain of the base polymer,
   wherein each of the blanket, the print plate and the etch resist solution has a non-polar surface energy value, a polar surface energy value, and a surface energy value that is a sum of the non-polar surface energy value and a polar surface energy value,
   wherein the non-polar surface energy value of the etch resist solution is greater than the non-polar surface energy value of the blanket and is less than the non-polar surface energy value of the print plate, and
   wherein the polar surface energy value of the etch resist solution is greater than the polar surface energy value of the blanket and is less than the polar surface energy value of the print plate.

2. The fabricating method according to claim 1, wherein an adhesive force between the etch resist solution and the print plate is stronger than an adhesive force between the etch resist solution and the blanket.

3. The fabricating method according to claim 1, wherein the base polymer is any one of novolac, poly methyl methacrylate or poly methyl acrylate.

4. The fabricating method according to claim 1, wherein the carrier solvent is at least one alcohol.

5. The fabricating method according to claim 1, wherein the printing solvent is at least any one of N-Methyl pyrrolidone, ethyl benzoate or tri-isopropyl benzene.

6. The fabricating method according to claim 1, wherein transferring the etch resist solution onto the projected part of the print plate further includes:
   contacting the etch resist solution with the surface of the projected part while rotating the print roller device which is coated with the etch resist solution.

7. The fabricating method according to claim 1, further comprising:
   providing a substrate where a thin film layer is formed; and
   transferring the etch resist solution left in the print roller device onto the thin film layer to form the etch resist of the same shape as a groove of the print plate onto the thin film layer.

* * * * *